United States Patent [19]

Ono et al.

[11] Patent Number: 4,980,015
[45] Date of Patent: Dec. 25, 1990

[54] METHOD FOR PULLING SINGLE CRYSTALS

[75] Inventors: Naoki Ono, Omiya; Michio Kida, Urawa; Yoshiaki Arai, Omiya; Kensho Sahira, Yono, all of Japan

[73] Assignee: Mitsubishi Metal Corporation, Tokyo, Japan

[21] Appl. No.: 360,126

[22] Filed: Jun. 1, 1989

[30] Foreign Application Priority Data

Feb. 3, 1989 [JP] Japan .................................. 1-25191

[51] Int. Cl.⁵ ..................... C30B 15/02; C30B 27/02; C30B 29/06
[52] U.S. Cl. .................................. 156/605; 156/617.1; 156/620.3; 156/620.4; 156/DIG. 64; 422/249
[58] Field of Search ............... 156/617.1, 620.2, 620.3, 156/620.4, DIG. 64, 607, 605; 422/245, 249

[56] References Cited

U.S. PATENT DOCUMENTS

| | | | |
|---|---|---|---|
| 2,892,739 | 10/1954 | Rusler | 156/620.3 |
| 4,134,785 | 1/1979 | Lavigna et al. | 156/601 |
| 4,200,621 | 3/1980 | Liaw et al. | 156/620.4 |
| 4,594,173 | 6/1986 | Hobgood et al. | 156/607 |
| 4,846,927 | 7/1989 | Takahashi | 156/607 |

*Primary Examiner*—Gary P. Straub
*Attorney, Agent, or Firm*—Cushman, Darby & Cushman

[57] ABSTRACT

In a method for pulling a single crystal, employing a double crucible assembly, the dopant concentration of the molten raw material in an inner crucible prior to the pulling, is raised to a value higher than the dopant concentration C of the molten raw material in the inner crucible at the steady state. Furthermore, at the initial stage of the pulling, the raw material having a dopant content ratio of no greater than kC is introduced into the outer crucible at a rate greater than the rate of decrease of the molten raw material within the inner crucible during the pulling, to achieve a concentration ratio of dopant between the inner and outer crucibles at a target value. Subsequently, the raw material having kC as the dopant content ratio is introduced into the outer crucible, at a rate equal to the rate of decrease of the molten raw material during the pulling.

5 Claims, 4 Drawing Sheets

FIG.1 *(PRIOR ART)*
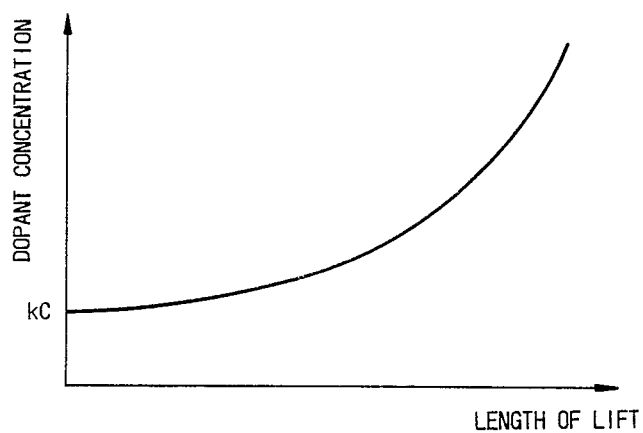
FIG.2 *(PRIOR ART)*
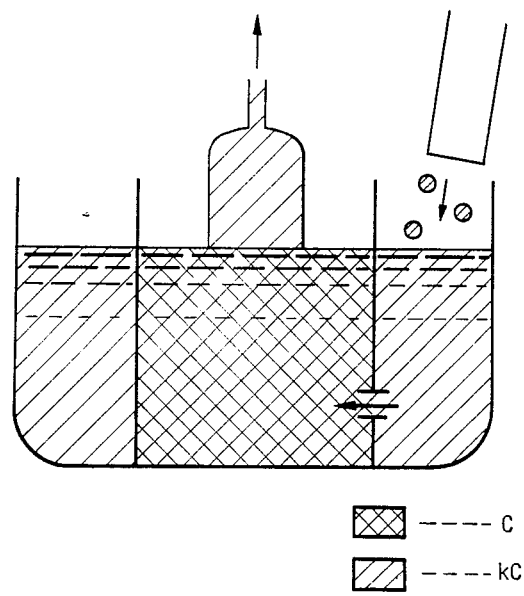

FIG. 3 *(PRIOR ART)*
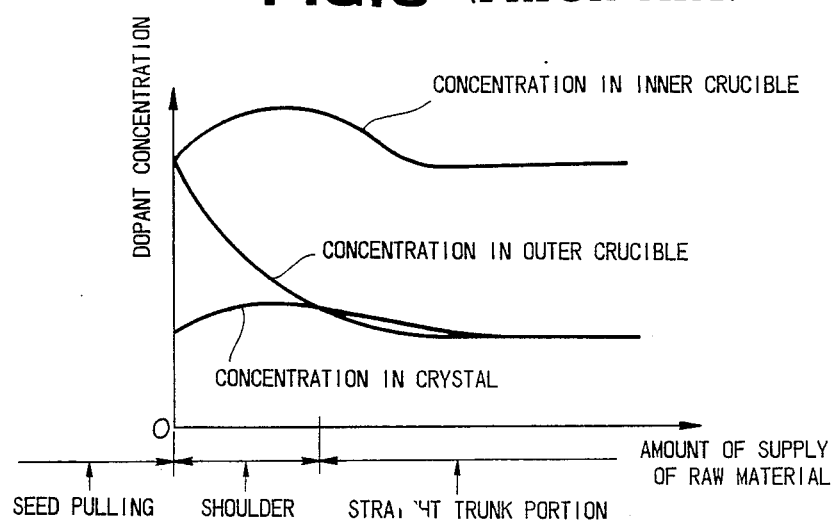
FIG. 4
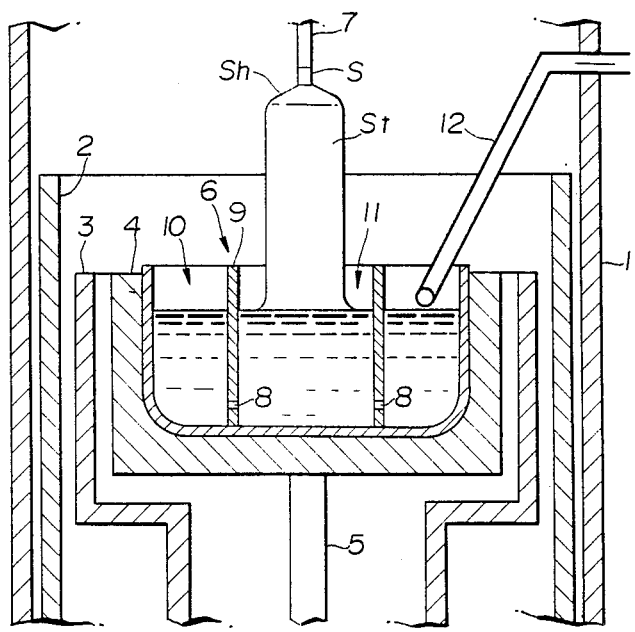

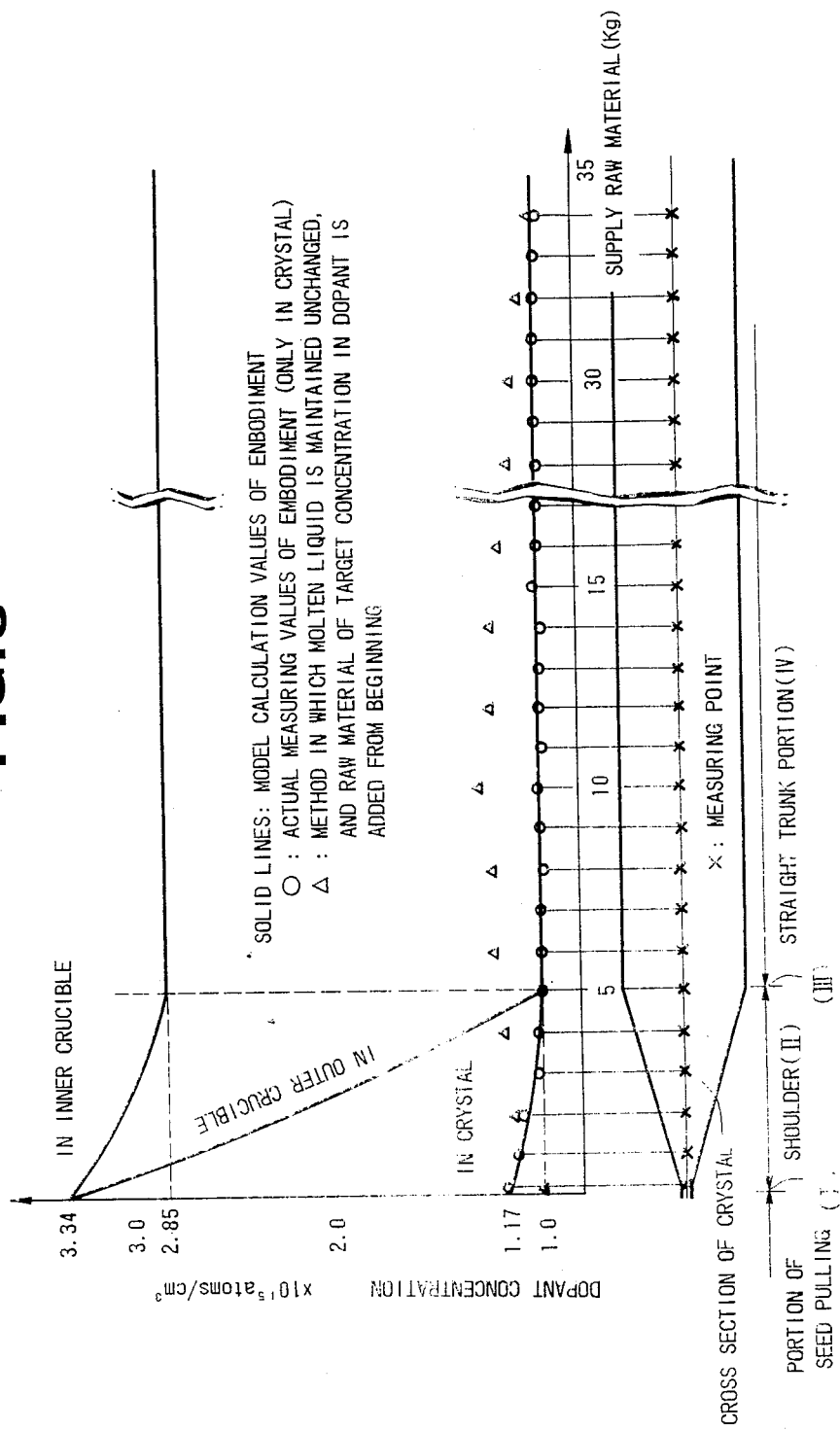

METHOD FOR PULLING SINGLE CRYSTALS

BACKGROUND OF THE INVENTION

The present invention relates to a method for pulling single crystals.

The Czochralski method is known, in which a single crystal such as a semiconductor crystal is pulled from molten liquid within a crucible assembly, and is thereby grown. In this case, the crucible assembly is often double and comprises outer and inner crucibles which communicate with each other. When the single crystal is pulled from this double crucible assembly, the crystal is pulled from the surface of the molten liquid or melt within the inner crucible, while a raw material and a dopant are supplied to the outer crucible to compensate for the decrease in volume in the inner crucible, making it possible to pull the single crystal continuously. In this case, the liquid within both the crucibles flows through communication holes in the inner crucible. Accordingly, temperature fluctuations and vibration resulting from the supply of the raw material are not transmitted directly to the surface from which the single crystals is pulled. Thus, there are the advantages that it is possible to obtain stable operation and superior quality.

In general, the dopant concentration of the pulled single crystal is given by kC when the dopant concentration in the molten raw material is C and where k is a segregation coefficient which is usually less than 1. Accordingly, if the molten raw material is not replenished following the pulling, the dopant in the molten raw material becomes gradually more concentrated, and the dopant in the resulting single crystal also becomes more concentrated, as shown in FIG. 1. When the double crucible assembly described above is employed to pull the single crystal continuously, however, the dopant concentration in the raw material fed successively is made equal to the dopant concentration in the pulled single crystals, and the amount of single crystal pulled per unit time is made equal to the amount of supply of the raw material. By doing so, the amounts of dopant supplied and pulled are balanced with each other so that the concentration ratio in dopant between the inner and outer crucibles can always be maintained at C : kC, as shown in FIG. 2. Thus, concentration of the dopant in the molten raw material is prevented, making it possible to render the dopant concentration constant. Accordingly, it is made possible to manufacture a single crystal having no concentration variation in the growth direction.

When the above-described apparatus is employed, however, the dopant concentration is increased in the portion first drawn from the starting material, resulting in a considerable portion of the single crystal being defective. More specifically, when the double crucible assembly is used to pull the single crystal continuously, the supply of the raw material per unit time into the outer crucible is made equal to the amount of the single crystal pulled per unit time to prevent the total amount of the molten liquid from varying. By doing so, however, even if the concentration of the dopant at the initial stage of the pulling is C in both the inner and outer crucibles and the dopant concentration in the subsequently supplied raw material is kC, it is known that concentration occurs in the dopant in the inner crucible at the initial stage of the pulling, resulting in a "hump" in the concentration gradient in the longitudinal direction of the product, as shown in FIG. 3. This "hump" extends for a considerable length along the straight trunk of the crystal, resulting in a large amount of the crystal product having an inappropriate dopant concentration.

SUMMARY OF THE INVENTION

It is therefore the object of the invention to provide a method for pulling a single crystal which is capable of minimizing variations in the dopant concentration in the crystal at the initial stage of pulling.

According to the invention, there is provided an improved method for pulling a single crystal, comprising the steps of preparing a double crucible assembly having an outer crucible and an inner crucible which communicate with each other; feeding raw material to the double crucible assembly to provide molten raw material therein; and pulling the single crystal from the surface of the molten raw material within the inner crucible in such a manner that during the steady state, the pulled single crystal has a dopant concentration of about kC, where k is the segregation coefficient and C the dopant concentration of the molten raw material in the inner crucible at the steady state; the improvement comprising raising the dopant concentration of the molten raw material in the inner crucible prior to the pulling, to a value higher than the dopant concentration C of the molten raw material in the inner crucible at the steady state; at the initial stage of the pulling, introducing the raw material having a dopant content ratio of no greater than kC into the outer crucible at a rate greater than the rate of decrease of the molten raw material within the inner crucible during the pulling, to achieve a concentration ratio of dopant between the inner and outer crucibles at a target value; and subsequently, introducing the raw material having kC as the dopant content ratio into said outer crucible, at a rate equal to the rate of decrease of the molten raw material during the pulling.

With the above described process, the first portion of the crystal which is solidified just after the start of the pulling (the so called shoulder) demonstrates almost no variation in the concentration of the dopant. Because the molten raw material in the outer crucible flows into the inner crucible, the concentration within the inner crucible lowers until it reaches the steady state concentration C. Because relatively unconcentrated raw material is introduced into the outer crucible, its concentration is closer to the steady state concentration kC, than the inner crucible. The flow is always from the outer crucible to the inner crucible, never the reverse, so that dopant diffusion and thus equibration of the dopant concentration does not occur.

In order to lower the dopant concentration in the high concentration partition, the dopant concentration ratio should be quickly set to 1:k. This is accomplished by starting with a comparatively small amount of the molten raw material. Then, as the pulling operation commences and as raw material is incorporated into the forming crystal, adding the low concentration raw material at a relatively faster rate so that the surface level of the molten liquid in the inner crucible actually rises. Because the low concentration raw material is added to the extent that the total amount of often liquid increases, the concentration ratio between the inner and outer crucibles quickly reaches its target value. When the concentration ratio of 1:k is reached, if the forming crystal is drawn at a steady rate and the dopant concentration of the introduced raw material is set to equal the concentration in the forming crystal kC, then from that point a crystal having a fixed, uniform concentration of dopant can be drawn.

BRIEF DESCRIPTION OF THE INVENTION

FIG. 1 is a graphical representation of the change in dopant concentration in an inner crucible at an initial stage of pulling of a single crystal in a conventional method;

FIG. 2 is a diagrammatic view of the dopant concentrations in the inner and outer crucibles at a steady state pulling of the single crystal;

FIG. 3 is a graphical representation of the variation of the dopant concentration in the inner and outer crucibles and the product in the conventional method;

FIG. 4 is a cross-sectional view of an apparatus used in the preferred embodiment of the invention;

FIG. 6 is a view showing the measurement values of the change in concentration of the dopant in single crystals manufactured as shown in FIGS. 4 and 5 in comparison with calculation values.

DETAILED DESCRIPTION OF THE PREFERRED EMBODIMENTS

Figure 5A:
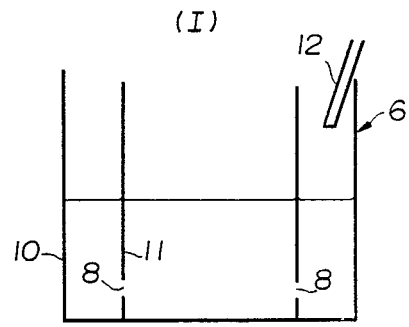
FIGS. 5a through 5d are diagrammatic views of a sequence of processes of the preferred embodiment of the invention.

The invention will be described, by way of an example, with reference to the drawings.

Referring to FIG. 4, there is shown in cross-section a crystal growth apparatus for carrying into a practice a single-crystal pulling method according to the invention The apparatus comprises a furnace 1. A heat-insulating material 2 is arranged within the furnace 1 in concentric relation thereto. A heater 3 is arranged within the heat insulating material 2 in concentric relation thereto. The heater 3 is composed of a pair of upper and lower portions, and the upper portion is larger in diameter than the lower portion. A graphite susceptor 4 fixedly mounted on the top of a rotary shaft 5 is arranged within the upper portion of the heater 3 in concentric relation thereto. A double crucible assembly 6 made of quartz is fitted into the upper surface of the graphite susceptor 4 in concentric relation thereto. A pulling shaft 7 has a lower end thereof to which a seed S is fixedly connected. The double crucible assembly 6 is divided into a pair of outer and inner crucibles 10 and 11 by means of a tubular or cylindrical partition wall 9. The partition wall 9 has a pair of diametrically opposed communication holes 8 and 8 which are located adjacent to the bottom of the inner crucible 11. The inner and outer crucibles 10 and 11 communicate with each other through the pair of communication holes 8 and 8. Arranged above the double crucible assembly 6 is a pulling mechanism (not shown) for pulling the pulling shaft 7 while rotating the same. Further, a tubular chute 12 is provided, which has one end thereof extending through a wall of the furnace 1. The other end of the chute 12 is located within the outer crucible 10 to feed semiconductor raw material and a dopant into the outer crucible 10.

Figure 5C:
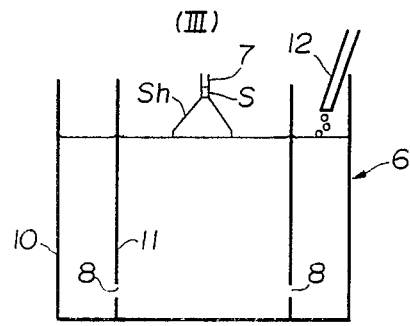
Figure 5B:
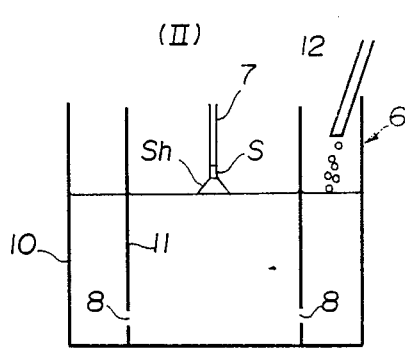
Figure 5D:
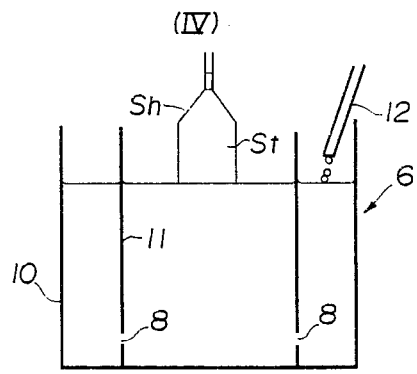

The single-crystal pulling method according to the invention due to the above-mentioned crystal growth apparatus will be described below with reference to the diagrammatical views in FIGS. 5a to 5d and the graph in FIG. 6. In this connection, let it be supposed that, in the embodiment described below that the target dopant concentration in the crystals is kC where k is the segregation coefficient and C is the dopant concentration in the molten raw material in the inner crucible 11 at the steady state. Further let it be supposed that the amount of molten raw material within the crucible assembly 6 is W during the steady state pulling, the ratio of the volume within the inner crucible 11 to the total volume of the crucible assembly 6 is a, and the concentrations of dopant in the outer and inner crucibles 10 and 11 are equal to each other at the initial stage. In this case, as described above, the concentrations of dopant at a steady state in the outer and inner crucibles 10 and 11 are C and kC. The sequence of the process will be described from the start-up of the pulling to the steady state.

(1) Initial Stage

The raw material and the dopant are fed into the crucible assembly 6, and are melted to form a melt or a molten liquid less in amount than W and higher in concentration than C. This will be referred to as stage I (see FIG. 5a).

(2) Pulling of the Shoulder

The pulling shaft 7 is moved upwardly to start the pulling of the crystal, and raw material including no dopant is supplied continuously through the chute 12. This will be referred as stage II (see FIG. 5b). The speed of supply of the raw material is set to a value higher than the speed of decrease of the molten liquid due to the pulling, so that the molten liquid within the crucible assembly 6 is W at completion of the shoulder $S_h$. This will be referred to as stage III (see FIG. 5c). Since in this case the surface level is rising more quickly than the pulling speed of the seed crystal S, the crucible assembly 6 must be lowered, or the raising speed of the seed S must be increased, so that the speed of the seed S relative to the surface level is appropriate.

(3) Steady State Pulling

At the point of time the pulling of the shoulder $S_h$ is completed, the amount of molten liquid is W, the concentration of dopant in the molten liquid within the inner crucible 11 is C, and the concentration of dopant in the molten liquid within the outer crucible 10 is kC. Subsequently, the step of pulling the straight trunk $S_t$ is maintained at a steady state. The dopant concentration in the raw material is kC. Thus the dopant is added at a rate corresponding to the amount of decrease in the dopant due to the pulling of the crystal. This will be referred to as stage IV (see FIG. 5d).

Hereunder, a model calculation will be used to describe the above processes in more detail. Let it be supposed that a total amount of molten liquid at the above initial stage is W', the amount of molten liquid within the outer crucible 10 is $W_b$, the amount of molten liquid within the inner crucible 11 is $W_c$, the amount of dopant in the outer crucible 10 is B, the amount of raw material from the initial stage to a point of time during the pulling of the shoulder $S_h$ is x, the dopant concentration within the outer crucible 10 at this point of time is b(x), and the dopant concentration within the inner crucible 11 is c(x). Then, b(x) and c(x) are given by the following equations (1) and (2). In this connection the following calculation is based on the following assumptions (a) through (c).

(a) The dopant concentrations in the respective inner and outer crucibles 10 and 11 are uniform with respect to each other by means of convection.

(b) Influence of diffusion of the dopant between the inner and outer crucibles 10 and 11 through the communication holes 8 and 8 can be neglected as will be described later.

(c) The amount of decrease in he molten liquid due to the pulling of the shoulder $S_t$ can be neglected, because both the raw material and the dopant are less in amount.

$$b(x) = BW_b^{a/(1-a)}\{(1-a)x + W_b\}^{-1/(1-a)} \quad (1)$$

$$c(x) = \frac{-(1-a)BW_b^{a/(1-a)}\{(1-a)x + W_b\}^{-a/(1-a)} + B}{a\{W_b + (1-a)x\}} \quad (2)$$

If the amount of supply of the raw material at completion of lifting of the shoulder $S_n$ is $s_1$, then the following relationship exists:

$$c(x_1) : b(x_1) = 1 : k \quad (3)$$

From the equations (1), (2) and (3), the following relationship exists:

$$x_1 = \{W_b/(1-a)\}[\{a+k(1-a)\}/k]^{(1-a)/a} - 1 \quad (4)$$

In the equation (1), let it be supposed that $x=0$, and $x=x_1$. Then, the ratio between them can be expressed by the following equation:

$$b(0)/b(x_1) = [\{(a+k(1-a)\}/k]^{1/a} \quad (5)$$

Here, the following relationship exists:

$$b(x_1) = kC$$

Accordingly, the initial dopant concentration can be expressed by the following equation.

$$b(0) = [\{a+k(1-a)\}/k]^{1/a}kC \quad (6)$$

In addition, the following relationships exist:

$$W = x_1 + W_b + W_c \quad (7)$$

$$W_c = W_b a/(1-a) \quad (8)$$

$$W' = W_b + W_c \quad (9)$$

From the above equations, the following relationship exists:

$$W'/W = [k/(a+k(1-a))]^{(1-a)/a} \quad (10)$$

That is, the initial amount of the raw material within the crucible assembly 6 should be decreased as indicated by the above equation (10).

Hereunder, consideration will be made if actual values are used. Let it be supposed that the ratio of the bottom surface area of the inner crucible 11 with respect to the entire crucible assembly 6 is $a = \frac{2}{3}$, silicon is used as the raw material, and phosphorus is fed as the dopant. Then, k is equal to 0.35.

If the above values are substituted for the equations (6) and (10), the following relationships exist:

$$b(0) = 3.3kC = 1.16C, \text{ and}$$

$$W'/W = 0.67$$

That is, the amount of the raw material should be $\frac{2}{3}$ of that at the steady state, and the initial concentration of the dopant should be 1.16 times the concentration of the dopant in the inner crucible 11 at the steady state. For instance, the double crucible assembly 6 is considered, in which the inner crucible 11 is 200 mm in inner diameter, the outer crucible 10 is 240 mm in inner diameter, the partition wall 9 is 10 mm in thickness, and each of the communication holes 8 and 8 is 5 mm in diameter. In this double crucible assembly 6, 15 Kg of molten liquid is incorporated in the double crucible assembly 6 at the steady state, and a silicon single crystal having a target dopant (phosphorus) concentration $kC = 1.00 \times 10^{15}$ atoms/cm$^3$ and having a diameter of 3 inches is pulled at speed of 1 mm/min. In this case, an initial amount of the molten liquid should be 10 kg, the dopant concentration should be $3.34 \times 10^{15}$ atoms/cm$^3$, and 5 Kg of raw material including no dopant should be supplied to the outer crucible 10, until the completion of the shoulder $S_h$. In the case where pulling is made under such conditions, i.e., the initial dopant concentration $3.34 \times 10^{15}$ atoms/cm$^3$, actual measured values of the dopant concentration in the longitudinal direction on the thus obtained single crystal are indicated by O in FIG. 6, and the model calculation values of the molten liquid in the inner and outer crucibles 10 and 11 and the dopant concentration of the single crystals are indicated by the solid lines in comparison.

Further, FIG. 6 also shows the conventional pulling which is indicated by Δ as a comparison example. That is, the actual values of the dopant concentration in the single crystal from the following case. Specifically, the symbols indicate that a double crucible assembly the same as that described above is employed, and the total amount of initial molten liquid is 15 Kg, the dopant concentration of the molten liquid is $C = 2.86 \times 10^{15}$ atoms/cm$^3$, and the raw material having it dopant content of $kC = 1.00 \times 10^{15}$ atoms/cm$^3$ is supplied to the outer crucible 10 in an amount corresponding to the amount of pulling. In this case, a "hump" due to the increase in the dopant concentration extends after the completion point of the lifting of the shoulder $S_h$, that is, after stage III and extends to the straight trunk portion $S_t$.

In this connection, during the pulling of the shoulder $S_h$, or during the steady state pulling, diffusion of the dopant through the communication holes 8 and 8 was estimated roughly by the use of the Fick's law. The rough estimate indicated that the diffusion speed of the dopant through the communication holes 8 and 8 was about $9.5 \times 10^{-4}$ cm/sec and, in distinction thereto, the inflow speed of the molten liquid was 0.93 cm/sec during the pulling of the shoulder $S_h$ and 0.17 cm/sec during the steady state pulling. Thus, it was estimated that the uniformity of the dopant due to self-diffusion gives rise to almost no problem.

Although in the above embodiment, the dopant concentration of the pulled single crystal at the steady state has been set to kC, it may vary with the range of $kC \pm 0.1kC$. Furthermore, in the above calculation, the dopant concentration of the silicon single crystal has been $1.00 \times 10^{15}$ atoms/cm$^3$, but the usual range to be practiced is between $1.00 \times 10^{14}$ atoms/cm$^3$ and $1.00 \times 10^{16}$ atoms/cm$^3$.

What is claimed is:

1. In an improved method for pulling a single crystal, comprising the steps of preparing a double crucible assembly having an outer crucible and an inner crucible which communicate with each other; feeding raw material to said double crucible assembly to provide molten raw material therein; and pulling the single crystal from the surface of the molten raw material within said inner crucible in such a manner that during the steady state, the pulled single crystal has a dopant concentration of about kC, where k is the segregation coefficient and C the dopant concentration of the molten raw material in said inner crucible at the steady state; the improvement comprising:

raising the dopant concentration of the molten raw material in said inner crucible prior to the pulling, to a value higher than the dopant concentration C of the molten raw material in said inner crucible at the steady state; and at the initial stage of the pulling, introducing the raw material having a dopant content ratio of less than kC into said outer crucible at a rate greater than the rate of decrease of thé molten raw material within said inner crucible during the pulling, to achieve a concentration ratio of dopant between said inner and outer crucibles at such a target value that the ratio of the dopant concentration in the outer crucible to the dopant concentration in the inner crucible is k; and subsequently, introducing the raws material having kC as the dopant content ratio into said outer crucible, at a rate equal to the rate of decrease of the molten raw material during the pulling.

2. A method for pulling a single crystal according to claim 1, wherein said molten raw material is silicon including phosphorus as said dopant.

3. A method for pulling a single crystal according to claim 1, including:

melting the raw material and the dopant to form the molten raw material, which has a concentration of dopant greater than the concentration of dopant (c) in the inner crucible at the steady state, so as to be less in amount than the molten raw material in the crucible assembly at the steady state;

subsequently commencing the pulling of the single crystal;

introducing the raw material including no dopant continuously into the outer crucible at such a speed that the amount of the molten raw material int eh crucible assembly becomes equal to the amount of the molten raw material in the crucible assembly at the steady state when the pulling of a shoulder of the single crystal is completed;

at the point of time that the pulling of the shoulder is completed, effecting the steady state pulling by introducing the raw material having kC as the dopant content ratio into said outer crucible at a rate equal to the rate of decrease of the molten raw material during the pulling, to thereby form a straight trunk of the single crystal.

4. A method for pulling a single crystal according to claim 3, wherein during the step of introducing the raw material including no dopant continuously into the outer crucible at said speed, the crucible assembly is lowered by the rate of rise of the surface level of the molten raw material in the crucible assembly relative to the pulling speed of the single crystal.

5. A method for pulling a single crystal according to claim 3, wherein during the step of introducing the raw material including no dopant continuously into the outer crucible at said speed, the pulling speed of the single crystal is increased by the rate of rise of the surface level of the molten raw material in the crucible assembly relative to the pulling speed of the single crystal.

* * * * *